(12) United States Patent
Chien

(10) Patent No.: US 11,470,738 B2
(45) Date of Patent: Oct. 11, 2022

(54) FIXING SUPPORT AND ELECTRONIC DEVICE

(71) Applicant: CINCOZE CO., LTD., New Taipei (TW)

(72) Inventor: Hsin-Te Chien, New Taipei (TW)

(73) Assignee: CINCOZE CO., LTD., New Taipei (TW)

( * ) Notice: Subject to any disclaimer, the term of this patent is extended or adjusted under 35 U.S.C. 154(b) by 47 days.

(21) Appl. No.: 17/320,230

(22) Filed: May 14, 2021

(65) Prior Publication Data

US 2022/0272857 A1 Aug. 25, 2022

(30) Foreign Application Priority Data

Feb. 22, 2021 (TW) .................................. 110106118

(51) Int. Cl.
*H05K 7/14* (2006.01)
(52) U.S. Cl.
CPC .................................. *H05K 7/1417* (2013.01)
(58) Field of Classification Search
CPC ........................... H05K 7/1417; H05K 7/1418
See application file for complete search history.

(56) References Cited

U.S. PATENT DOCUMENTS 8,267,581 B2 * 9/2012 Li ........................ G06F 1/1624
384/7

FOREIGN PATENT DOCUMENTS

KR 20170083880 A * 7/2017 ............. G06F 1/183

* cited by examiner

*Primary Examiner* — Mukundbhai G Patel

(57) ABSTRACT

A fixing support includes first, second and third fixing units and limiting elements. The first fixing unit has a first slide groove extending in first direction. The second fixing unit includes a second-direction fixing portion and a second-direction sliding portion. The second-direction fixing portion has a second slide groove extending in second direction. The second-direction sliding portion is slidably disposed at the second slide groove. The third fixing unit includes a third-direction fixing portion and a third-direction sliding portion. The third-direction fixing portion has a third slide groove extending in third direction. The third-direction sliding portion is slidably disposed at the third slide groove. The limiting elements allow the first, second and third fixing units to slidably connect to each other and allow the first, second and third directions to be linearly independent of each other. An electronic device is further introduced.

12 Claims, 11 Drawing Sheets

FIXING SUPPORT AND ELECTRONIC DEVICE

CROSS-REFERENCE TO RELATED APPLICATION

This non-provisional application claims priority under 35 U.S.C. § 119(a) on Patent Application No(s). 110106118 filed in Taiwan, R.O.C. on Feb. 22, 2021, the entire contents of which are hereby incorporated by reference.

BACKGROUND OF THE INVENTION

1. Field of the Invention

The present disclosure relates to fixing supports and electronic devices, and in particular to a fixing support capable of fixing electronic components in place in three independent directions and an electronic device comprising the fixing support.

2. Description of the Related Art

Computers are common electronic products for use in daily life and industrial applications. In general, a computer comprises a motherboard, operating units (for example, CPU), power unit (for example, power supply) and various electronic components capable of enhancing operating efficiency or performing input/output functions, for example, a display card, memory, hard disk drive, etc. Take the display card as an example, users insert it into a dock on the motherboard to electrically connect it to the motherboard and the other operating units. The dock fixes the display card to the motherboard. However, when the computer is installed on an unmanned vehicle or in workplaces where there are intensive vibrations, the display card is, under its own weight, likely to detach from the dock, and the detachment is likely to damage the dock. In view of this, a fixing support for fixing electronic components in place is provided inside the computer casing. However, commercially-available, existing supports fix electronic components in place only at specific positions or are adjustable only in one or two directions. When users have to install electronic components of different brands, specifications or dimensions, the fixing support is useless, thereby causing a waste of materials and incurring cost.

BRIEF SUMMARY OF THE INVENTION

An objective of the present disclosure is to provide

To achieve at least the above objective, the present disclosure provides a fixing support for fixing electronic components in place in three independent directions and an electronic device comprising the fixing support, so as to enhance usage flexibility of the electronic device and reduce adjustment time.

The present disclosure provides a fixing support comprising a first fixing unit, a second fixing unit, a third fixing unit and a plurality of limiting elements. The first fixing unit has thereon a first slide groove, and the first slide groove extends in a first direction. The second fixing unit comprises a second direction fixing portion and a second direction sliding portion. The second direction fixing portion has thereon a second slide groove. The second slide groove extends in a second direction, and the second direction sliding portion is slidably disposed at the second slide groove. The third fixing unit comprises a third direction fixing portion and a third direction sliding portion. The third direction fixing portion has thereon a third slide groove, and the third slide groove extends in a third direction. The third direction sliding portion is slidably disposed at the third slide groove. The limiting elements allow the first fixing unit, second fixing unit and third fixing unit to slidably connect to each other and allow the first direction, second direction and third direction to be linearly independent of each other.

In an embodiment, the fixing support further comprises a holding element fixed in place relative to a casing of an electronic device and forming a slide groove extending in one of the first direction, the second direction and the third direction, wherein one of the first fixing unit, the second fixing unit and the third fixing unit is slidably disposed at the slide groove.

In an embodiment, one of the first fixing unit, the second fixing unit and the third fixing unit comprises a fastening portion, wherein one of the first fixing unit, the second fixing unit and the third fixing unit is fixedly disposed on the holding element through the fastening portion selectively.

In an embodiment, the electronic device further comprises a circuit board, and the holding element is fixedly disposed on the circuit board.

In an embodiment, the first fixing unit comprises a slide groove portion and a connection portion, wherein the first slide groove is formed on the slide groove portion, wherein the connection portion is positioned proximate to the slide groove portion and has at least one fastening hole.

In an embodiment, the second direction fixing portion comprises a erected board and an extension element, wherein the erected board is slidably disposed at the first slide groove through at least one said limiting element, wherein the extension element comprises a slide groove portion and a connection portion, wherein the second slide groove is formed on the slide groove portion, and the connection portion is bent relative to the slide groove portion and fixedly disposed on the erected board.

In an embodiment, the erected board comprises an upright portion and at least one limiting portion bending relative to the upright portion and extending in the second direction.

In an embodiment, the third direction fixing portion is fixedly disposed on second direction fixing portion and comprises a bottom surface and an end surface positioned proximate to the bottom surface, wherein the third slide groove is disposed on the bottom surface and dents relative to the bottom surface, wherein the end surface has thereon at least one guiding hole extending in the third direction to penetrate the third direction fixing portion, wherein the third direction sliding portion comprises at least one guiding element, and the third direction sliding portion is slidably, penetratingly disposed at the at least one guiding hole through the at least one guiding element.

In an embodiment, the third direction sliding portion further comprises a sliding element, the sliding element comprising an extending portion and a pressing portion, the extending portion having thereon a limiting groove extending in the third direction, wherein the pressing portion bends relative to the extending portion, and the at least one guiding element is penetratingly disposed at the pressing portion.

In an embodiment, the second direction sliding portion and the third direction sliding portion comprise a sliding element and a damping element, respectively, and are adapted to abut against an electronic component, wherein each said damping element is disposed between the electronic component and a corresponding one of the sliding elements, wherein the damping elements are of lower rigidity than the sliding element, respectively.

In an embodiment, the first direction, the second direction and the third direction are perpendicular to each other.

The present disclosure further provides an electronic device comprising a casing, a circuit board and the fixing support. The circuit board is disposed in the casing. The fixing support is connected to the casing and circuit board.

Regarding the fixing support of the present disclosure, the first fixing unit, second fixing unit and third fixing unit fix electronic components in place in the first direction, second direction and third direction, respectively. With each fixing unit being capable of sliding independently, the present disclosure speeds up adjustments carried out by users. The electronic device of the present disclosure comprises the fixing support which is adjustable in order for electronic components to be changed to different specifications, thereby enhancing the ease of use of the electronic device.

DETAILED DESCRIPTION OF THE INVENTION

To facilitate understanding of the object, characteristics and effects of this present disclosure, embodiments together with the attached drawings for the detailed description of the present disclosure are provided.

Figure 1:
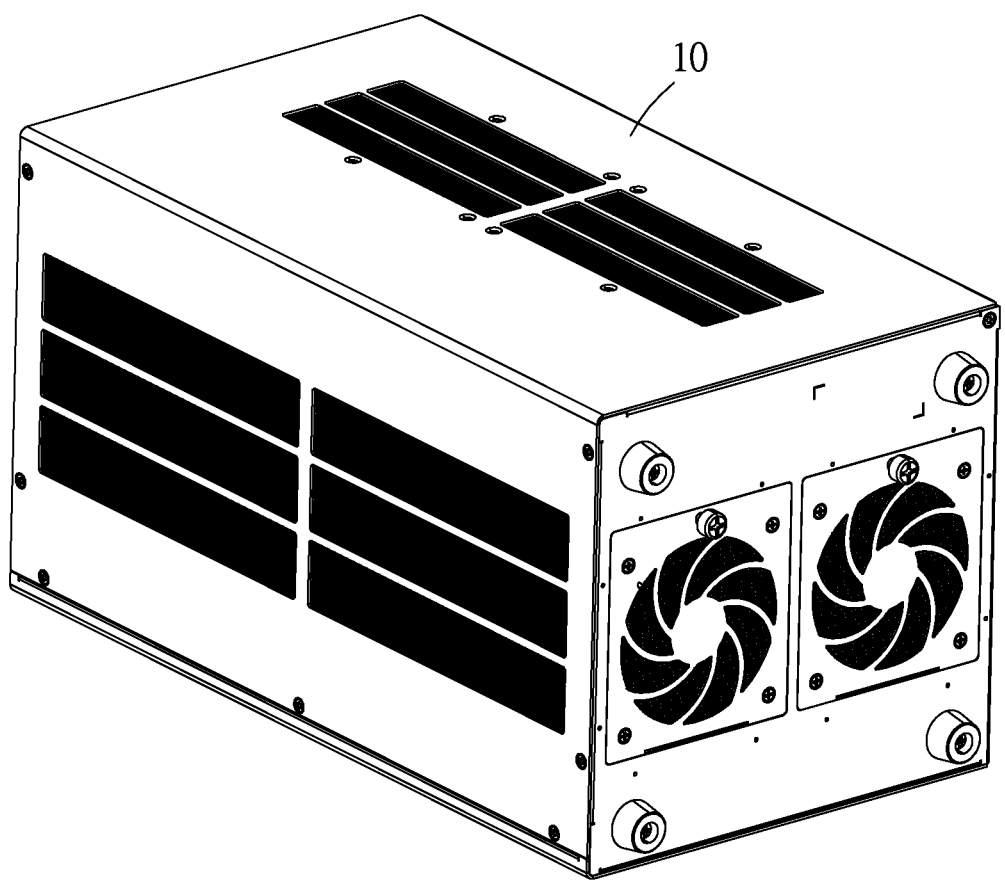
FIG. 1 is a perspective view of an electronic device according to an embodiment of the present disclosure.
Figure 2:
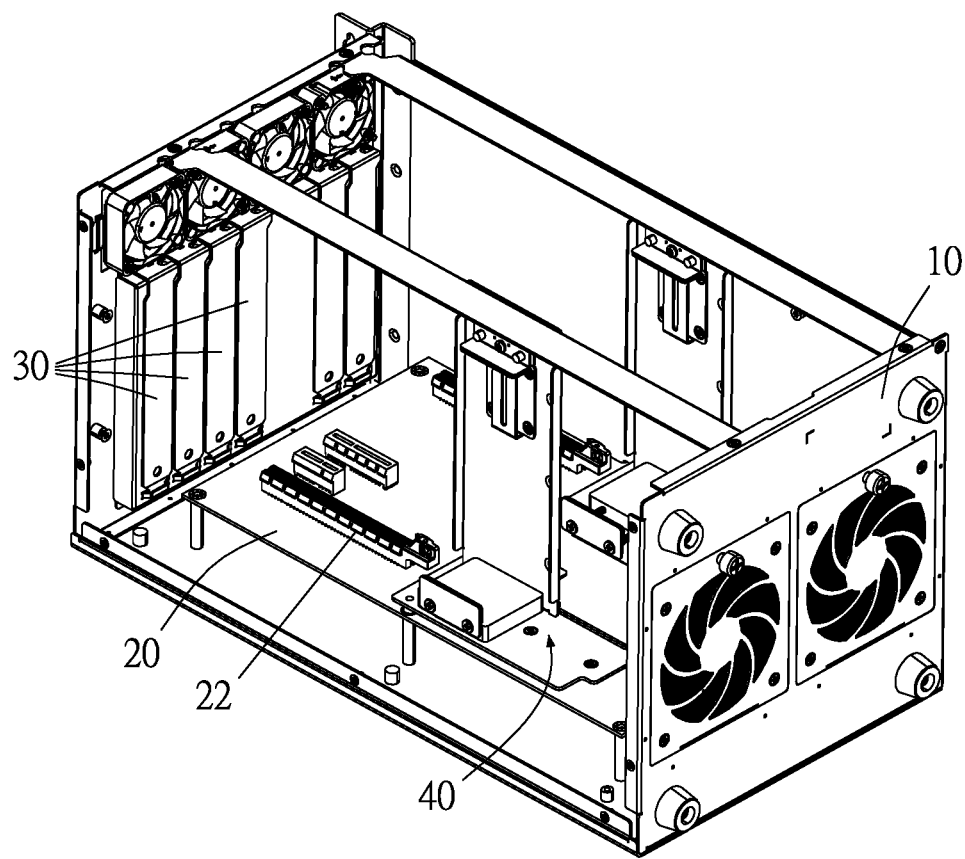
FIG. 2 is a cutaway view of the electronic device of FIG. 1.
Figure 3:
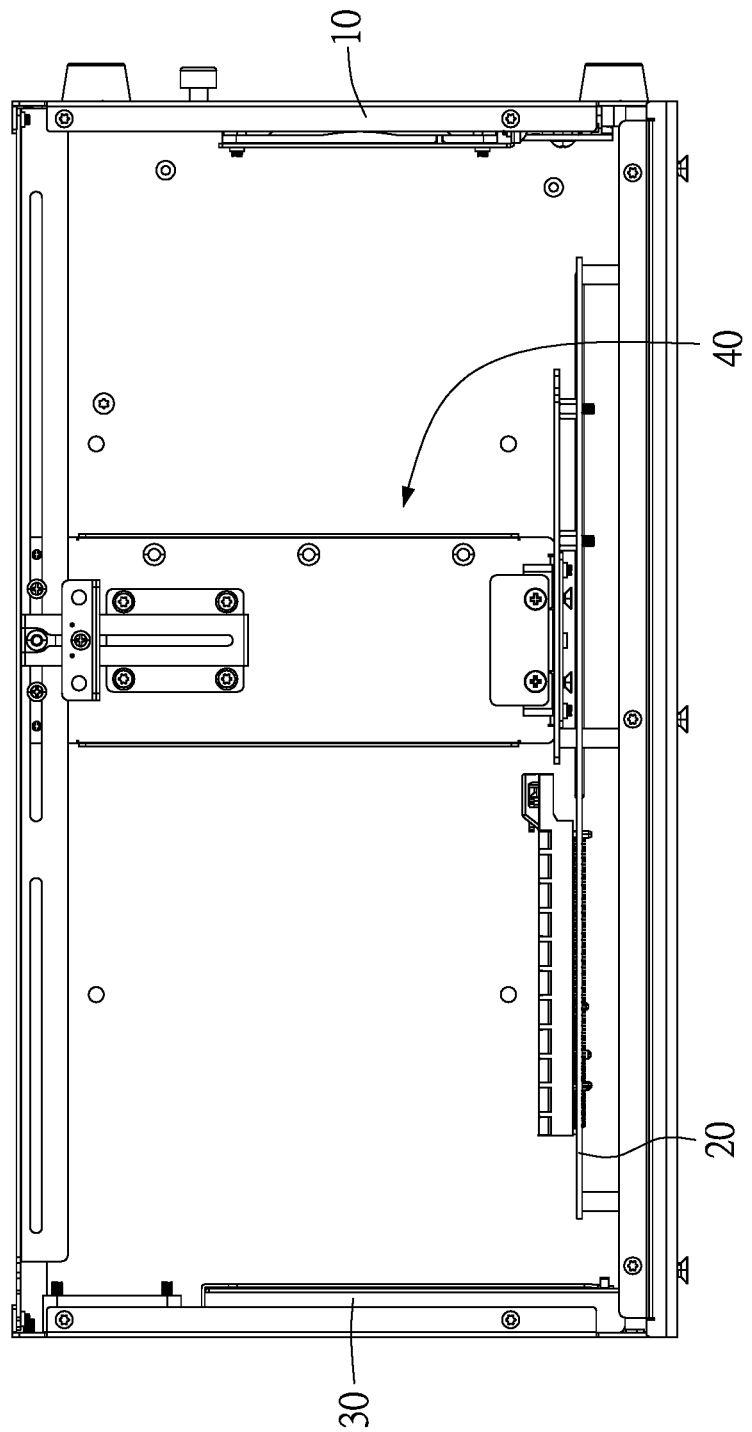
FIG. 3 is a front view of the electronic device of FIG. 2.

Refer to FIG. 1 through FIG. 3. FIG. 1 is a perspective view of an electronic device according to an embodiment of the present disclosure. FIG. 2 is a cutaway view of the electronic device of FIG. 1. FIG. 3 is a front view of the electronic device of FIG. 2. In this embodiment, the electronic device 1 is, for example, an industrial computer and comprises a casing 10, a circuit board 20, a plurality of ports 30 and at least one fixing support 40. The circuit board 20 is, for example, the motherboard of a computer and is disposed in the casing 10. The ports 30 are disposed on the casing 10 to mount expansion units, such as a hard disk drive and a network card, on the casing 10. The fixing support 40 is disposed in the casing 10 and connected to the casing 10 and circuit board 20.

The electronic device 1 comprises heavyweight high-power electronic components, for example, the display card. Preferably, the circuit board 20 has thereon a plurality of docks 22 whereby the electronic components are mounted on the circuit board 20. The electronic device 1 is installed at workplaces where there are bumpy surfaces or frequent vibrations. The electronic components are connected to the circuit board 20 through the docks 22; as a result, the circuit board 20 is structurally undermined by load concentration, thereby ending up with shortened service life. Thus, in this embodiment, the fixing supports 40 are in the number of two and are is positioned proximate to the docks 22, respectively. In a variant embodiment, the fixing supports 40 are in the number of one or at least three. However, the present disclosure is not limited thereto.

Figure 4:
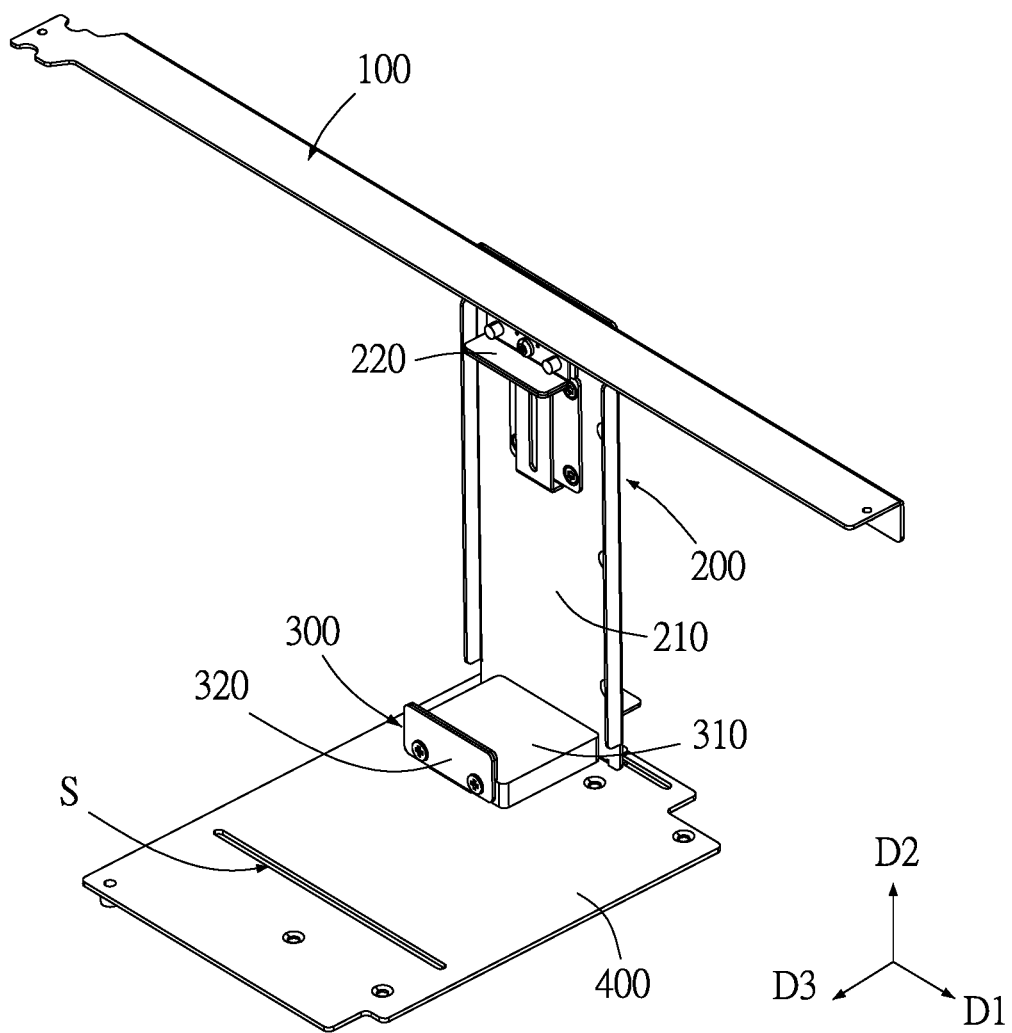
FIG. 4 is a perspective view of the fixing support of FIG. 2 at an initial position.

Referring to FIG. 4, there is shown a perspective view of the fixing support of FIG. 2 at an initial position. In this embodiment, the fixing support 40 comprises a first fixing unit 100, a second fixing unit 200, a third fixing unit 300 and a plurality of limiting elements 500 (shown in FIG. 6). The second fixing unit 200 comprises a second direction fixing portion 210 and a second direction sliding portion 220. The third fixing unit 300 comprises a third direction fixing portion 310 and a third direction sliding portion 320. The limiting elements 500 enable the first fixing unit 100, second fixing unit 200 and third fixing unit 300 to slidably connect to each other. Preferably, fixing support 40 further comprises a holding element 400. The holding element 400 is fixed in place relative to the casing 10 and has at least one slide groove S. The slide groove S extends in first direction D1. The second fixing unit 200 is slidably disposed at slide groove S.

The first fixing unit 100 extends in first direction D1. The second direction sliding portion 220 and third direction sliding portion 320 slide relative to the second direction fixing portion 210 and third direction fixing portion 310 in second direction D2 and third direction D3, respectively. The first direction D1, second direction D2 and third direction D3 are linearly independent of each other. Preferably, first direction D1, second direction D2 and third direction D3 are perpendicular to each other. In a variant embodiment, first direction D1, second direction D2 and third direction D3 are parallel to the edges of the casing 10. However, the present disclosure is not limited thereto.

Figure 5:
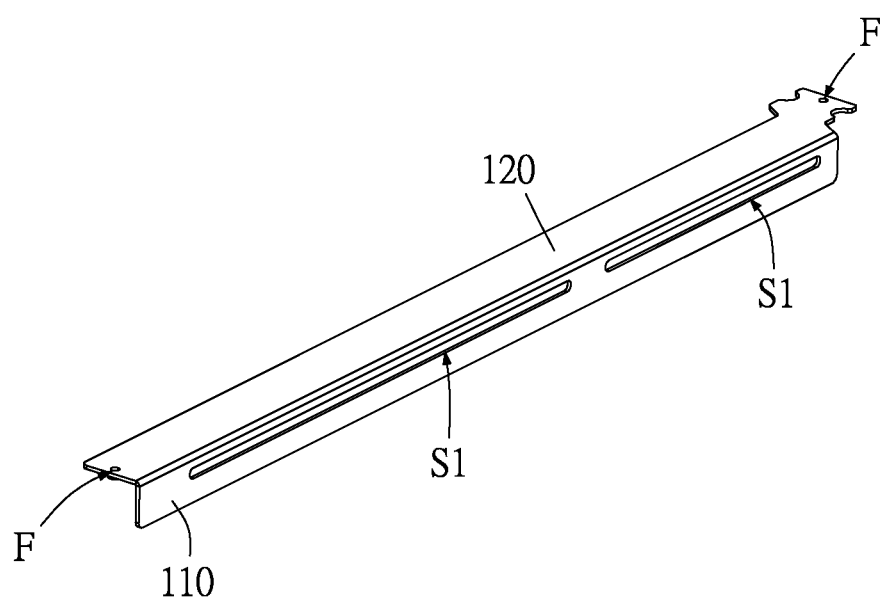
FIG. 5 is a perspective view of the first fixing unit of FIG. 4.

FIG. 5 is a perspective view of the first fixing unit of FIG. 4. When the fixing support 40 fixes an electronic component, such as a display card, in place, the first fixing unit 100 allows the fixing support 40 to slide in first direction D1. The first fixing unit 100 comprises a slide groove portion 110 and a connection portion 120. The slide groove portion 110 has thereon a first slide groove S1. The first slide groove S1 extends in first direction D1. The connection portion 120 is positioned proximate to slide groove portion 110 and bent relative to slide groove portion 110. The connection portion 120 has thereon at least one fastening hole F. In order for users to mount the fixing support 40 in place, screws, rivets or any other fastening elements are penetratingly disposed at a fastening hole F and holes on the casing 10, such that the first fixing unit 100 is fixedly disposed on the casing 10. With the connection portion 120 bending relative to the slide groove portion 110, both the first slide groove S1 and the fastening hole F are not coplanar. The electronic components or the fixing units in any other direction slide within the first slide groove S1, and the surface tension of the slide groove portion 110 is unlikely to be transferred to the fastening hole F, thereby preventing any sliding load from widening the gaps between the fastening hole F and fastening elements.

Figure 6:
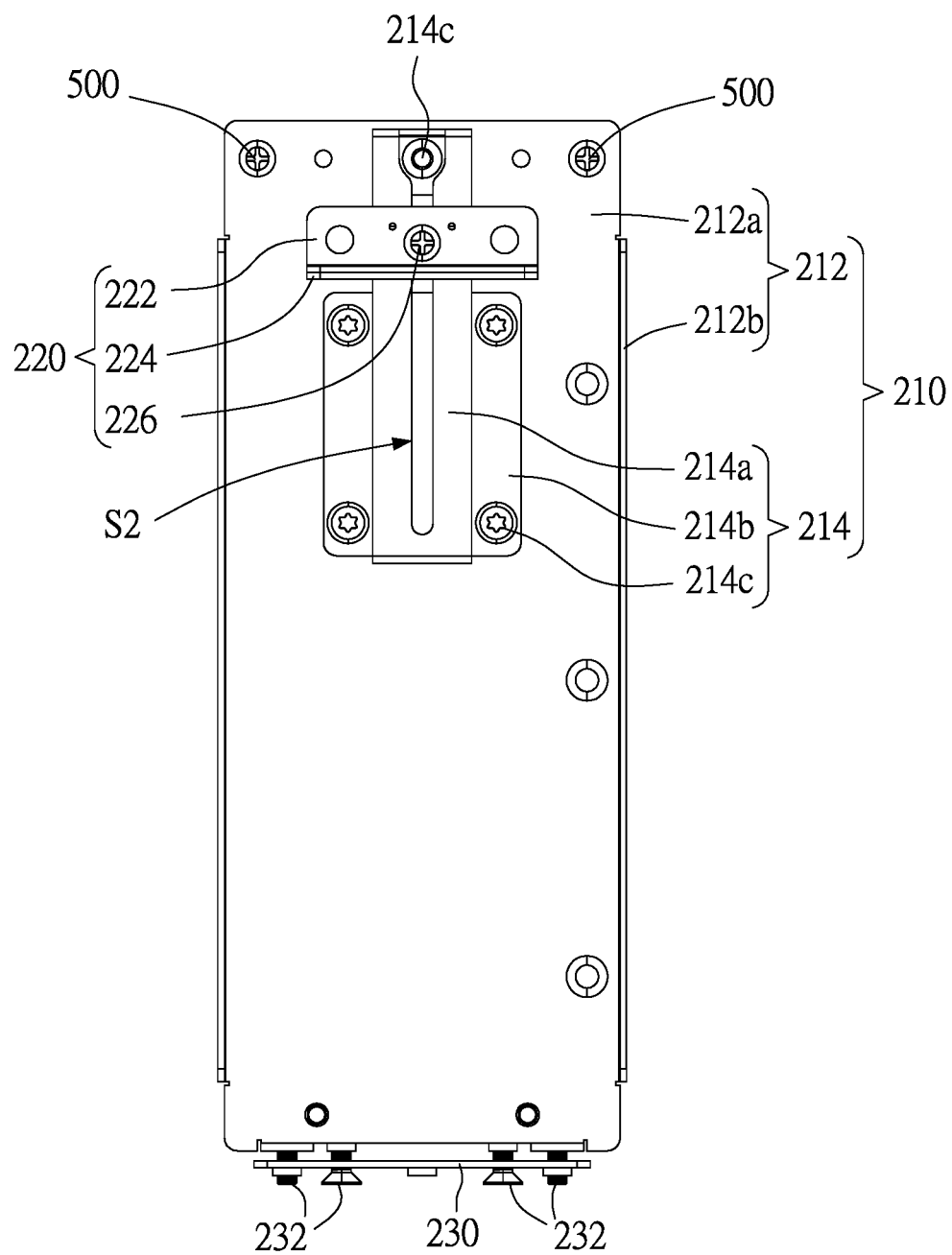
FIG. 6 is a front view of the second fixing unit of FIG. 4.
Figure 7:
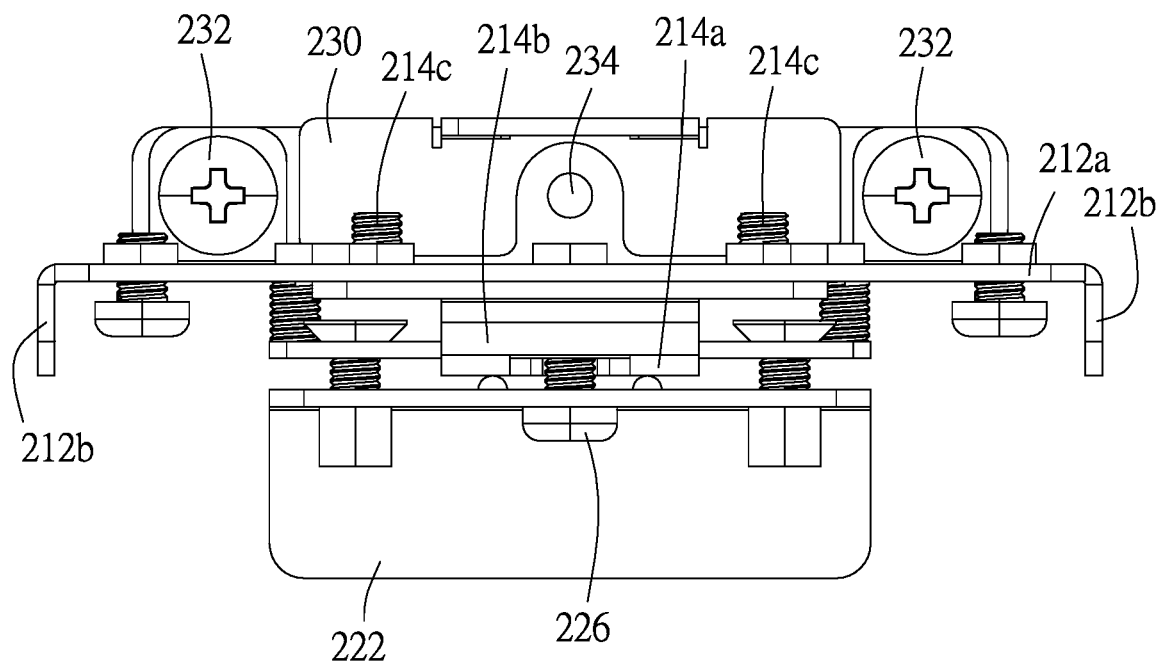
FIG. 7 is a top view of the second fixing unit of FIG. 6.
Figure 8:
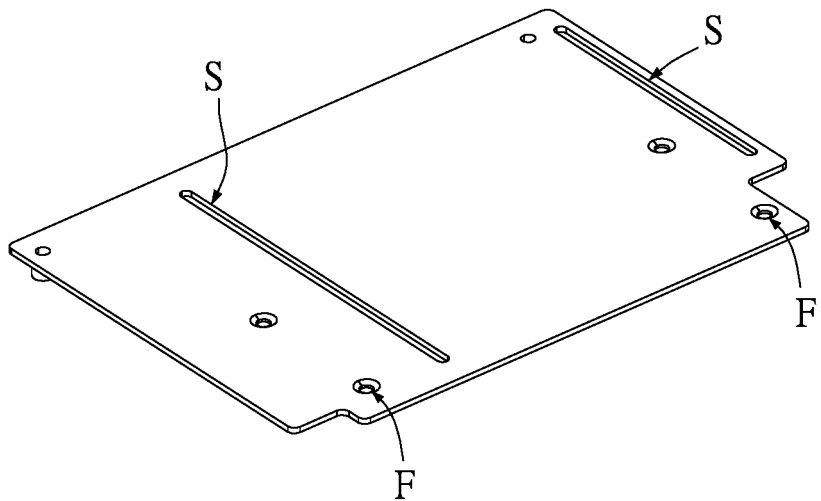
FIG. 8 is a perspective view of the holding element of FIG. 4.

FIG. 6 is a front view of the second fixing unit of FIG. 4. FIG. 7 is a top view of the second fixing unit of FIG. 6. FIG. 8 is a perspective view of the holding element of FIG. 4. Referring to FIG. 6 and FIG. 7, the second direction fixing portion 210 comprises an erected board 212 and an extension element 214. The limiting elements 500 allow the erected board 212 to be slidably disposed at first slide groove S1; thus, the fixing support 40 can slide in first direction D1. The first fixing unit 100 and holding element 400 together bear the weight of the electronic components. The erected board 212 comprises an upright portion 212a and at least one limiting portion 212b. In this embodiment, the limiting portions 212b are, for example, in the number of two and are disposed on the two sides of the upright portion 212a, respectively, bent relative the upright portion 212a, and extend in second direction D2. The users press the electronic components against upright portion 212a, such that the limiting portion 212b and the electronic components abut against each other in first direction D1 to prevent the electronic components from sliding relative to the fixing support 40 in first direction D1.

Like the first fixing unit 100, the extension element 214 comprises a slide groove portion 214a, a connection portion 214b and a plurality of fastening elements 214c. The slide groove portion 214a has thereon a second slide groove S2. The second slide groove S2 extends in second direction D2. The second direction sliding portion 220 is slidably disposed at second slide groove S2. The connection portion 214b connects to the slide groove portion 214a and bends relative to the slide groove portion 214a. In this embodiment, the connection portions 214b are in the number of two and are disposed at the upper and lower ends of the slide groove portion 214a, respectively. The slide groove portion 214a and the connection portions 214b together form a C-shaped structure, such that the connection portions 214b are fixedly disposed on the erected board 212 through the fastening elements 214c. Hence, the second direction sliding portion 220 protrudes relative to the erected board 212 in third direction D3. When the electronic components are of great thickness in third direction D3, the extension element 214 enable the second direction sliding portion 220 to press against and thus draw the electronic components toward the thickness center of the electronic components, thereby precluding detachment or stress concentration.

The second direction sliding portion 220 abuts against the electronic components in second direction D2. In this embodiment, the second direction sliding portion 220 comprises a sliding element 222, a damping element 224 and a positioning element 226. The sliding element 222 is, for example, made of metal. The damping element 224 is, for example, provided in the form of a sponge pad and disposed between the sliding element 222 and electronic components. The damping element 224 is of lower rigidity than the sliding element 222. The positioning element 226 is, for example, a screw and nut and is penetratingly disposed at the sliding element 222 and second slide groove S2. To mount the electronic components on the second fixing unit 200, users place the electronic components on the third direction fixing portion 310 and slide the second direction sliding portion 220 downward along the second slide groove S2 until the sliding element 222 and damping element 224 abut against the electronic components. After that, the users fix the sliding element 222 to the extension element 214 through the positioning element 226, allowing the electronic components to be fixed in place in second direction D2 through second direction sliding portion 220.

Referring to FIG. 2 and FIG. 6 through FIG. 8, since the circuit board 20 has thereon the electronic components and is fragile, it is undesirable to have the second fixing unit 200 slidably disposed at the circuit board 20. In this embodiment, the fixing support 40 is penetratingly disposed at fastening hole F through a screw, rivet or any other fastening elements, such that the holding element 400 is fixedly disposed on circuit board 20. Furthermore, the second fixing unit 200 is slidably disposed at slide groove S of the holding element 400, allowing the second fixing unit 200 to slide relative to the circuit board 20 in first direction D1. Preferably, second fixing unit 200 further comprises a fastening portion 230. The fastening portion 230 comprises a metal plate which slides in first direction D1 and a plurality of fastening elements 232. When users slide the second fixing unit 200 along the first slide groove S1 to a specific position according to the size of the electronic components, the limiting elements 500 allow the upper edge of the erected board 212 to be fixed in place relative to the first fixing unit 100, whereas the fastening elements 232 and metal plate allow the lower edge of the erected board 212 to be fixed in place relative to the holding element 400, thereby determining the position of the second fixing unit 200 in first direction D1.

Figure 9:
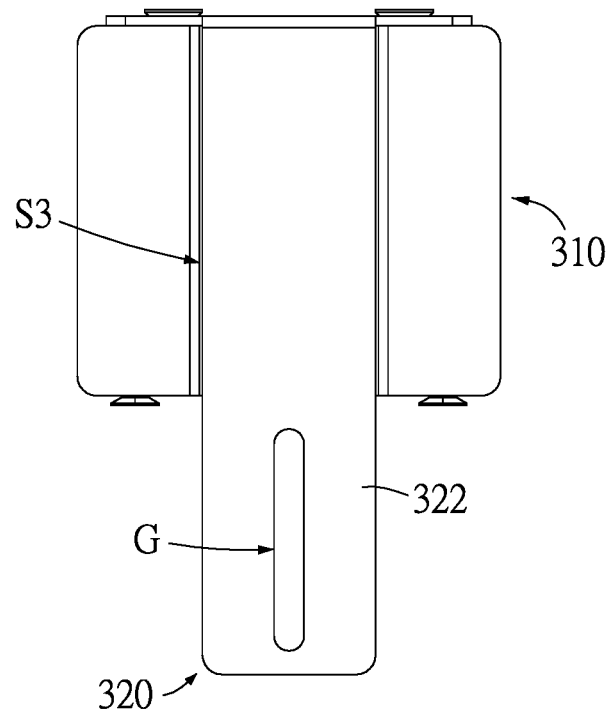
FIG. 9 is a top view of the third fixing unit of FIG. 4.
Figure 10:
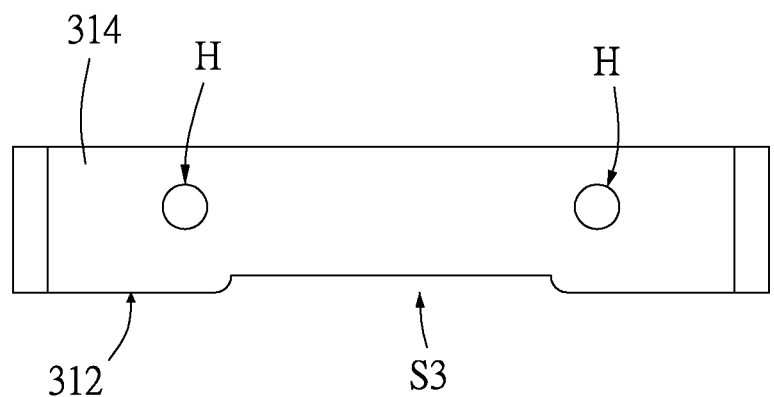
FIG. 10 is a front view of the third direction fixing portion of FIG. 9.
Figure 11:
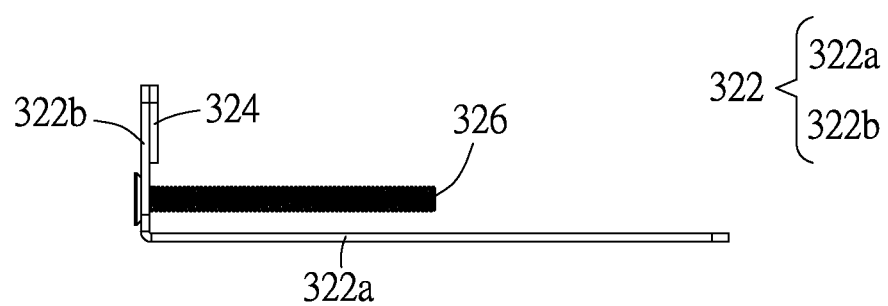
FIG. 11 is a right lateral view of the third direction sliding portion of FIG. 9.
Figure 12:
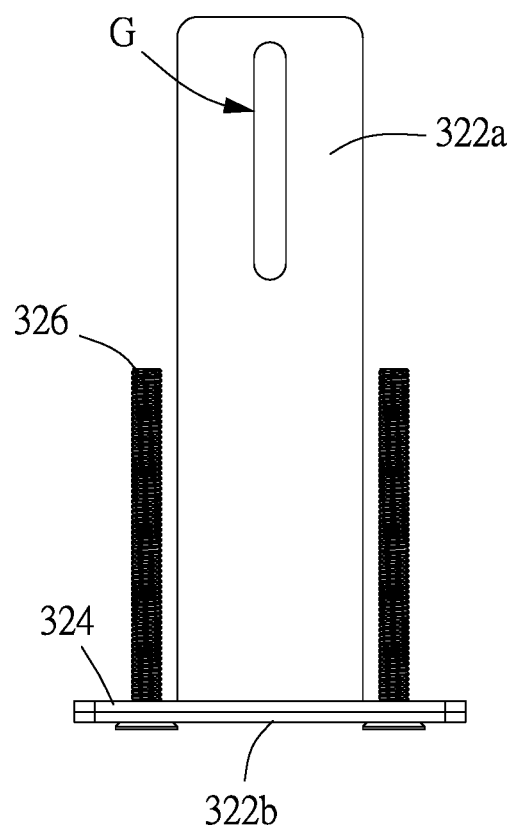
FIG. 12 is a top view of the third direction sliding portion of FIG. 11.

Refer to FIG. 9 through FIG. 12. FIG. 9 is a top view of the third fixing unit of FIG. 4. FIG. 10 is a front view of the third direction fixing portion of FIG. 9. FIG. 11 is a right lateral view of the third direction sliding portion of FIG. 9. FIG. 12 is a top view of the third direction sliding portion of FIG. 11. As shown in the diagrams, the third direction fixing portion 310 is fixedly disposed on erected board 212 of second direction fixing portion 210 and comprises a bottom surface 312 and an end surface 314. The bottom surface 312 and end surface 314 are positioned proximate to each other. The bottom surface 312 has thereon a third slide groove S3. The third direction sliding portion 320 comprises a sliding element 322 and a damping element 324. Preferably, third slide groove S3 dents relative to bottom surface 312 extends in third direction D3. The sliding element 322 of third direction sliding portion 320 is slidably disposed at third slide groove S3. Thus, third direction sliding portion 320 can slide in third direction D3. The sliding element 322 is received in the third slide groove S3, so as not to increase the volume of the third direction fixing portion 310 relative to the bottom surface 312.

Like the second fixing unit 200, the sliding element 322 is, for example, made of metal, whereas the damping element 324 is, for example, provided in the form of a sponge pad. The sliding element 322 comprises an extending portion 322a and a pressing portion 322b. The pressing portion 322b bends relative to the extending portion 322a, such that the electronic components are prevented from sliding relative to third direction sliding portion 320 in third direction D3. The damping element 324 is disposed between the pressing portion 322b and electronic components and is of lower rigidity than the sliding element 322. When the third direction sliding portion 320 fixes the electronic components in place in third direction D3, the damping element 324 protects the electronic device 1 in all working routines where vibrations cause the electronic components and sliding element 322 to collide and get damage.

Furthermore, in this embodiment, the fixing support 40 is capable of guiding the movement direction of the third direction sliding portion 320 and limiting its journey. Referring to FIG. 11 and FIG. 12, the third direction sliding portion 320 comprises at least one guiding element 326. The guiding element 326 is, for example, provided in the form of two screws. The two screws are penetratingly disposed at left and right ends of the pressing portion 322b, respectively. The end surface 314 has thereon at least one guiding hole H corresponding in number and position to the guiding element 326. The guiding hole H extends in third direction D3 and penetrates the third direction fixing portion 310. The extending portion 322a has thereon a limiting groove G. The limiting groove G extends in third direction D3. The fastening portion 230 further comprises a positioning element 234 (see FIG. 7). The positioning element 234 is, for example, a metal pin and is penetratingly disposed at limiting groove G. The users use a screwdriver to withdraw the guiding element 326 along third direction D3 by a required distance and thus determine the distance between the third direction sliding portion 320 and erected board 212. With the positioning element 234 being penetratingly disposed at limiting groove G, the direction of the sliding of the third direction sliding portion 320 is well guided to prevent errors.

Figure 13:
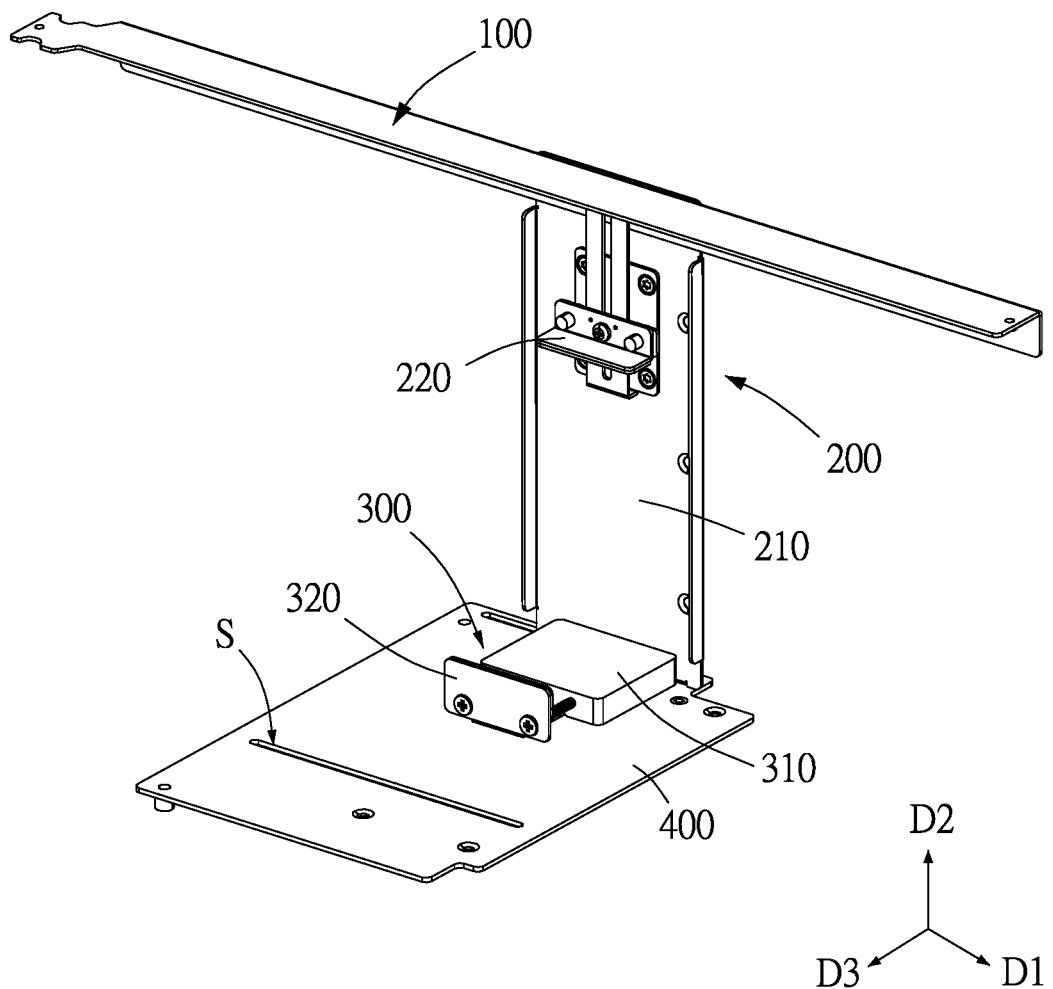
FIG. 13 is a perspective view of the fixing support of FIG. 4 at an adjusted position.

The way of using the fixing support 40 to fix electronic components in place according to this embodiment is described below. Referring to FIG. 13, there is shown a perspective view of the fixing support of FIG. 4 at an adjusted position. Preliminarily, users align electronic components with the docks 22 on the circuit board 20 and then loosen the limiting elements 500 and fastening elements 232 to adjust the position of the second fixing unit 200 relative to the first fixing unit 100 and holding element 400 in the first direction D1. Next, the users loosen the guiding element 326 to ensure that the distance between the sliding element 322 and erected board 212 becomes greater than the thickness of the electronic components.

To mount the electronic components, users insert the electronic components into the docks 22 and abut them against third direction fixing portion 310. Then, users abut third direction sliding portion 320 against the electronic components and tighten the guiding element 326, thereby pressing them against each other. Next, users tighten the limiting elements 500 and fastening elements 232 to ensure that the positions of the second fixing unit 200 and third fixing unit 300 are no longer variable in first direction D1. Finally, users adjust the positioning element 226 such that the second direction sliding portion 220 presses against the upper ends of the electronic components, thereby fixing the electronic components in place in three independent directions.

Although in this embodiment the first fixing unit 100 is fixed in place relative to the casing 10 to allow the second fixing unit 200 and third fixing unit 300 to be slidably disposed at first slide groove S1 and third slide groove S3, respectively, in three directions, the present disclosure is not limited thereto. In a variant embodiment, the second fixing unit 200 or third fixing unit 300 is fixed in place relative to the casing 10 or circuit board 20, whereas the two other fixing units slide.

In this embodiment, the second fixing unit 200 comprises a fastening portion 230, and the lower edge of the erected board 212 is fastened to the holding element 400. However, in a variant embodiment, the holding element 400 lies beside the casing 10, whereas the first fixing unit 200 or third fixing unit 300 is fixedly disposed on the holding element 400 through the fastening portion 230.

In the final step of fixing, the electronic components press against third direction fixing portion 310, and then both the third direction sliding portion 320 and second direction sliding portion 220 press against the electronic components in third direction D3 and second direction D2, respectively. Alternatively, it is feasible for the second direction sliding portion 220 to fix the electronic components in place in second direction D2 and then for the third direction sliding portion 320 to fix its position in third direction D3, but the present disclosure is not limited thereto.

While the present disclosure has been described by means of specific embodiments, numerous modifications and variations could be made thereto by those skilled in the art without departing from the scope and spirit of the present disclosure set forth in the claims.

What is claimed is:

1. A fixing support, comprising:
    a first fixing unit having thereon a first slide groove, and the first slide groove extending in a first direction;
    a second fixing unit comprising a second direction fixing portion and a second direction sliding portion, the second direction fixing portion having thereon a second slide groove, the second slide groove extending in a second direction, and the second direction sliding portion being slidably disposed at the second slide groove;
    a third fixing unit comprising a third direction fixing portion and a third direction sliding portion, the third direction fixing portion having thereon a third slide groove, the third slide groove extending in a third direction, and the third direction sliding portion being slidably disposed at the third slide groove; and
    a plurality of limiting elements for allowing the first fixing unit, the second fixing unit and the third fixing unit to slidably connect to each other and allowing the first direction, the second direction and the third direction to be linearly independent of each other.

2. The fixing support of claim 1, further comprising a holding element fixed in place relative to a casing of an electronic device and forming a slide groove extending in one of the first direction, the second direction and the third direction, wherein one of the first fixing unit, the second fixing unit and the third fixing unit is slidably disposed at the slide groove.

3. The fixing support of claim 2, wherein one of the first fixing unit, the second fixing unit and the third fixing unit comprises a fastening portion, wherein one of the first fixing unit, the second fixing unit and the third fixing unit is fixedly disposed on the holding element through the fastening portion selectively.

4. The fixing support of claim 2, wherein the electronic device further comprises a circuit board, and the holding element is fixedly disposed on the circuit board.

5. The fixing support of claim 1, wherein the first fixing unit comprises a slide groove portion and a connection portion, wherein the first slide groove is formed on the slide groove portion, wherein the connection portion is positioned proximate to the slide groove portion and has at least one fastening hole.

6. The fixing support of claim 1, wherein the second direction fixing portion comprises an erected board and an extension element, wherein the erected board is slidably disposed at the first slide groove through at least one said limiting element, wherein the extension element comprises a slide groove portion and a connection portion, wherein the second slide groove is formed on the slide groove portion, and the connection portion is bent relative to the slide groove portion and fixedly disposed on the erected board.

7. The fixing support of claim 6, wherein the erected board comprises an upright portion and at least one limiting portion bending relative to the upright portion and extending in the second direction.

8. The fixing support of claim 1, wherein the third direction fixing portion is fixedly disposed on the second direction fixing portion and comprises a bottom surface and an end surface positioned proximate to the bottom surface, wherein the third slide groove is disposed on the bottom surface and dents relative to the bottom surface, wherein the end surface has thereon at least one guiding hole extending in the third direction to penetrate the third direction fixing portion, wherein the third direction sliding portion comprises at least one guiding element, and the third direction sliding portion is slidably, penetratingly disposed at the at least one guiding hole through the at least one guiding element.

9. The fixing support of claim 8, wherein the third direction sliding portion further comprises a sliding element, the sliding element comprising an extending portion and a pressing portion, the extending portion having thereon a limiting groove extending in the third direction, wherein the pressing portion bends relative to the extending portion, and the at least one guiding element is penetratingly disposed at the pressing portion.

10. The fixing support of claim 1, wherein the second direction sliding portion and the third direction sliding portion comprise a sliding element and a damping element, respectively, and are adapted to abut against an electronic component, wherein each said damping element is disposed between the electronic component and a corresponding one of the sliding elements, wherein the damping elements are of lower rigidity than the sliding element, respectively.

11. The fixing support of claim 1, wherein the first direction, the second direction and the third direction are perpendicular to each other.

12. An electronic device, comprising:
a casing;
a circuit board disposed in the casing; and
the fixing support of claim 1, the fixing support being connected to the casing and the circuit board.

* * * * *